(12) United States Patent
Shimura et al.

(10) Patent No.: US 10,755,786 B2
(45) Date of Patent: Aug. 25, 2020

(54) SEMICONDUCTOR MEMORY DEVICE INCLUDING A PLURALITY OF STRINGS EACH INCLUDING A SELECT TRANSISTOR AND A MEMORY CELL

(71) Applicant: Toshiba Memory Corporation, Minato-ku (JP)

(72) Inventors: Yasuhiro Shimura, Yokohama (JP); Yoshikazu Harada, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/298,473

(22) Filed: Mar. 11, 2019

(65) Prior Publication Data
US 2020/0090756 A1    Mar. 19, 2020

(30) Foreign Application Priority Data
Sep. 18, 2018  (JP) ................................. 2018-173601

(51) Int. Cl.
| | | |
|---|---|---|
| *G11C 16/10* | (2006.01) | |
| *G11C 16/04* | (2006.01) | |
| *G11C 16/34* | (2006.01) | |
| *G11C 11/56* | (2006.01) | |
| *G11C 16/08* | (2006.01) | |
| *H01L 27/1157* | (2017.01) | |

(Continued)

(52) U.S. Cl.
CPC .......... *G11C 16/10* (2013.01); *G11C 11/5671* (2013.01); *G11C 16/0483* (2013.01); *G11C 16/3459* (2013.01); *G11C 16/08* (2013.01); *G11C 16/26* (2013.01); *H01L 27/1157* (2013.01); *H01L 27/11582* (2013.01)

(58) Field of Classification Search
CPC . G11C 16/10; G11C 16/3459; G11C 16/0483; G11C 16/26; H01L 27/1157; H01L 27/11582
See application file for complete search history.

(56) References Cited

U.S. PATENT DOCUMENTS

| 6,643,188 B2 | 11/2003 | Tanaka et al. |
| 6,990,019 B2 | 1/2006 | Tanaka et al. |

(Continued)

FOREIGN PATENT DOCUMENTS

| JP | 3631463 B2 | 3/2005 |
| JP | 2015-176620 | 10/2015 |
| JP | 2018-41518 | 3/2018 |

*Primary Examiner* — Vanthu T Nguyen
(74) *Attorney, Agent, or Firm* — Oblon, McClelland, Maier & Neustadt, L.L.P.

(57) ABSTRACT

A semiconductor memory device according to an embodiment includes a plurality of strings each including a select transistor and a memory cell that can be set to any one of a plurality of different threshold voltages, a select gate line that is commonly connected to the select transistors of the plurality of strings, a plurality of bit lines that are individually connected to the plurality of strings, a word line that is commonly connected to the memory cells of the plurality of strings, and a control unit configured to execute a write sequence for repeatedly performing a plurality of loops each including a set of a program operation and a verify operation, and a voltage applied to the select gate line in the program operation of a last loop is lower than a voltage applied to the select gate line in the program operation of a first loop.

5 Claims, 15 Drawing Sheets

(51) Int. Cl.
 *H01L 27/11582* (2017.01)
 *G11C 16/26* (2006.01)

(56) References Cited

U.S. PATENT DOCUMENTS

| | | |
|---|---|---|
| 7,088,616 B2 | 8/2006 | Tanaka et al. |
| 7,224,615 B2 | 5/2007 | Tanaka |
| 7,286,404 B2 | 10/2007 | Tanaka et al. |
| 7,301,806 B2 | 11/2007 | Tanaka |
| 7,405,970 B2 | 7/2008 | Tanaka et al. |
| 7,468,908 B2 | 12/2008 | Tanaka |
| 7,672,168 B2 | 3/2010 | Tanaka et al. |
| 7,864,591 B2 | 1/2011 | Tanaka et al. |
| 8,208,311 B2 | 6/2012 | Tanaka et al. |
| 8,605,511 B2 | 12/2013 | Tanaka et al. |
| 8,767,487 B2 * | 7/2014 | Goda ............... G11C 16/04 365/189.16 |
| 8,929,135 B2 | 1/2015 | Tanaka et al. |
| 9,214,238 B2 | 12/2015 | Futatsuyama et al. |
| 9,257,189 B2 | 2/2016 | Tanaka et al. |
| 9,508,422 B2 | 11/2016 | Tanaka et al. |
| 9,786,378 B1 * | 10/2017 | Zhang ............. G11C 16/0483 |
| 10,049,760 B2 | 8/2018 | Shiino et al. |
| 10,068,657 B1 * | 9/2018 | Yu .................. G11C 29/028 |
| 2014/0003176 A1 | 1/2014 | Mui et al. |

* cited by examiner

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 9

| VERIFY TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | ○ | ○ | ○ | ○ | ○ | ○ | | | | | | | | | | | | | |
| "B" LEVEL (VfyB) | | ○ | ○ | ○ | ○ | ○ | ○ | ○ | | | | | | | | | | | |
| "C" LEVEL (VfyC) | | | | ○ | ○ | ○ | ○ | ○ | ○ | ○ | | | | | | | | | |
| "D" LEVEL (VfyD) | | | | | | ○ | ○ | ○ | ○ | ○ | ○ | ○ | | | | | | | |
| "E" LEVEL (VfyE) | | | | | | | | | ○ | ○ | ○ | ○ | ○ | ○ | | | | | |
| "F" LEVEL (VfyF) | | | | | | | | | | | | | ○ | ○ | ○ | ○ | | | |
| "G" LEVEL (VfyG) | | | | | | | | | | | | | | ○ | ○ | ○ | ○ | ○ | ○ |

FIG. 10

| WRITE TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | 0 | 0/1 | 0/1 | 0/1 | 0/1 | 0/1 | 0/1 | 0/1 | 1 | 1 | 1 | 1 | 1 | 1 | 1 | 1 | 1 | 1 | 1 |
| "C" LEVEL | 0 | 0 | 0 | 0 | 0/1 | 0/1 | 0/1 | 0/1 | 0/1 | 0/1 | 1 | 1 | 1 | 1 | 1 | 1 | 1 | 1 | 1 |
| "D" LEVEL | 0 | 0 | 0 | 0 | 0 | 0 | 0/1 | 0/1 | 0/1 | 0/1 | 0/1 | 0/1 | 1 | 1 | 1 | 1 | 1 | 1 | 1 |
| "E" LEVEL | 0 | 0 | 0 | 0 | 0 | 0 | 0 | 0/1 | 0/1 | 0/1 | 0/1 | 0/1 | 0/1 | 1 | 1 | 1 | 1 | 1 | 1 |
| "F" LEVEL | 0 | 0 | 0 | 0 | 0 | 0 | 0 | 0 | 0 | 0/1 | 0/1 | 0/1 | 0/1 | 0/1 | 0/1 | 1 | 1 | 1 | 1 |
| "G" LEVEL | 0 | 0 | 0 | 0 | 0 | 0 | 0 | 0 | 0 | 0 | 0 | 0 | 0 | 0/1 | 0/1 | 0/1 | 0/1 | 0/1 | 0/1 |

# SEMICONDUCTOR MEMORY DEVICE INCLUDING A PLURALITY OF STRINGS EACH INCLUDING A SELECT TRANSISTOR AND A MEMORY CELL

CROSS-REFERENCE TO RELATED APPLICATION

This application is based upon and claims the benefit of priority from the prior Japanese Patent Application No. 2018-173601 filed on Sep. 18, 2018; the entire contents of which are incorporated herein by reference.

FIELD

An embodiment described herein relates generally to a semiconductor memory device.

BACKGROUND

A NAND flash memory is known as a semiconductor memory device.

BRIEF DESCRIPTION OF THE DRAWINGS

FIG. 9 shows a diagram showing the relationship between a loop number and a program operation/verify operation during the write operation;

FIG. 10 is a diagram showing the relationship between the loop number and a bit line voltage during the write operation;

DETAILED DESCRIPTION

A semiconductor memory device of the present embodiment includes a plurality of memory strings each including a select transistor and a memory cell that is connected to one end of the select transistor and can be set to any one of at least four different threshold voltages; a select gate line that is commonly connected to gates of the select transistors of the plurality of memory strings; a plurality of bit lines that are individually connected to other ends of the select transistors of the plurality of memory strings; a word line that is commonly connected to gates of the memory cells of the plurality of memory strings; and a control unit configured to execute a write sequence to write predetermined data into the memory cells, the write sequence including a plurality of loops, each loop including a program operation to write data into the respective memory cells and a verify operation to verify the data written in the respective memory cells, wherein a voltage applied to the select gate line in the program operation of a last loop of the plurality of loops is lower than a voltage applied to the select gate line in the program operation of a first loop of the plurality of loops.

An embodiment will be described hereinafter with reference to the drawings.

(1. Configuration)

(1-1. Configuration of Memory System)

Figure 1:
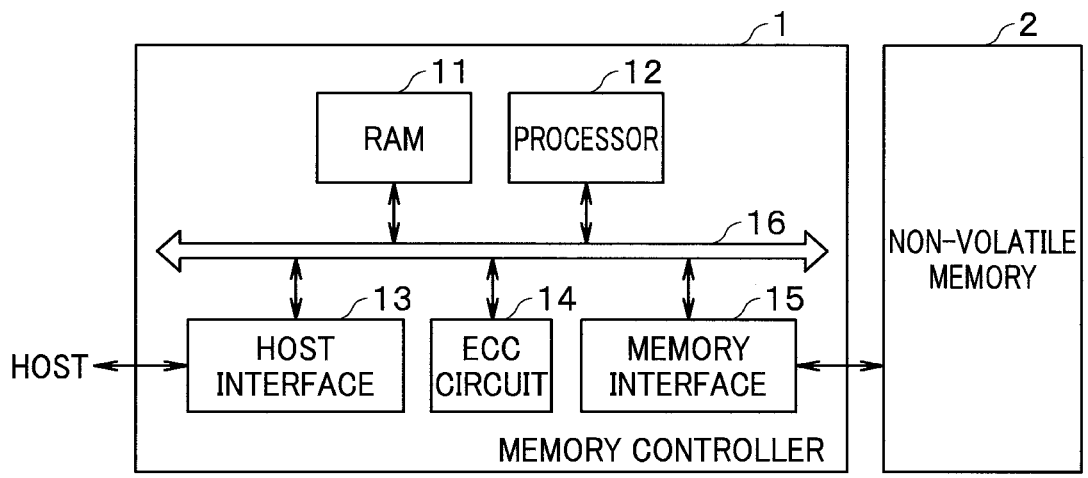
FIG. 1 is a block diagram showing a configuration example of a memory device according to an embodiment of the present invention.

FIG. 1 is a block diagram showing a configuration example of a memory system according to an embodiment of the present invention. The memory system of the present embodiment includes a memory controller 1 and a nonvolatile memory 2 as a semiconductor memory device. The memory system can be connected to a host. The host is, for example, an electronic device such as a personal computer, a portable terminal, or the like.

The nonvolatile memory 2 is a memory configured to store data in a nonvolatile manner, and includes, for example, a NAND memory (NAND flash memory). The present embodiment will be described on the assumption that the nonvolatile memory 2 is a NAND memory having memory cells, each of which is capable of storing 3 bits, that is, a NAND memory of 3 bits/Cell (TLC: triple level cell). The nonvolatile memory 2 is configured three-dimensionally.

The memory controller 1 controls writing of data into the nonvolatile memory 2 according to a write request from the host. Furthermore, the memory controller 1 controls reading of data from the nonvolatile memory 2 according to a read request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another via an internal bus 16.

The host interface 13 outputs a request, user data (writing data), and the like received from the host to the internal bus 16. Furthermore, the host interface 13 transmits user data read out from the nonvolatile memory 2, a response from the processor 12, and the like to the host.

The memory interface 15 controls processing of writing user data and the like into the nonvolatile memory 2 and processing of reading user data and the like from the nonvolatile memory 2 based on instructions from the processor 12.

The processor 12 totally controls the memory controller 1. The processor 12 is, for example, a CPU (central processing unit), an MPU (micro processing unit), or the like. When receiving a request from the host via the host interface 13, the processor 12 performs control according to the request. For example, the processor 12 instructs the memory interface 15 to write user data and a parity into the nonvolatile memory 2 according to a request from the host. Furthermore, the processor 12 instructs the memory interface 15 to read user data and a parity from the nonvolatile memory 2 according to a request from the host.

The processor 12 determines a storage region (memory region) on the nonvolatile memory 2 for user data to be stored in the RAM 11. The user data are stored in the RAM 11 via the internal bus 16. The processor 12 carries out the determination of the memory region for wiring and reading data in a page (page data) basis. The page is a unit of writing and reading. In this specification, user data stored in one page of the nonvolatile memory 2 is defined as unit data. The unit data is generally encoded and stored as a codeword in the nonvolatile memory 2. In the present embodiment, coding is not indispensable. The memory controller 1 may store the unit data in the nonvolatile memory 2 without encoding the unit data, but a configuration in which coding is performed is shown as one configuration example in FIG. 1. When the memory controller 1 does not perform coding, the page data coincides with the unit data. Also, one codeword may be generated based on one unit data, or one codeword may be generated based on divided data into which the unit data is divided. Furthermore, one codeword may be generated by using plural unit data.

The processor 12 determines a memory region of the nonvolatile memory 2 as a write destination on a unit-data basis. A physical address is allocated to a memory region of the nonvolatile memory 2. The processor 12 manages the memory region as the write destination for the unit data by using the physical address. The processor 12 designates the determined memory region (physical address) and instructs the memory interface 15 to write the user data into the nonvolatile memory 2. The processor 12 manages the correspondence between logical addresses of user data (logical addresses managed by the host) and physical addresses. When receiving a read request containing a logical address from the host, the processor 12 specifies the physical address corresponding to the logical address, designates the physical address, and instructs the memory interface 15 to read out user data.

The ECC circuit 14 encodes user data stored in the RAM 11 to generate a codeword. In addition, the ECC circuit 14 decodes a codeword read out from the nonvolatile memory 2.

The RAM 11 temporarily stores user data received from the host until the user data have been stored in the nonvolatile memory 2 or temporarily stores data read out from the nonvolatile memory 2 until the data have been transmitted to host. RAM 11 is a general-purpose memory such as a SRAM (static random access memory) or a DRAM (dynamic random access memory), for example.

FIG. 1 shows a configuration example in which the memory controller 1 includes the ECC circuit 14 and the memory interface 15. However, the ECC circuit 14 may be incorporated in the memory interface 15. Furthermore, the ECC circuit 14 may be incorporated in the nonvolatile memory 2.

When receiving a write request from the host, the memory system operates as follows. The processor 12 temporarily stores write-target data in the RAM 11. The processor 12 reads out the data stored in the RAM 11 and inputs the data to the ECC circuit 14. The ECC circuit 14 encodes the input data and inputs the codeword to the memory interface 15. The memory interface 15 writes the input codeword into the nonvolatile memory 2.

When receiving a read request from the host, the memory system operates as follows. The memory interface 15 inputs a codeword read out from the nonvolatile memory 2 to the ECC circuit 14. The ECC circuit 14 decodes the input codeword and stores the decoded data in the RAM 11. The processor 12 transmits the data stored in the RAM 11 to the host via the host interface 13.

(1-2. Configuration of Nonvolatile Memory)

Figure 2:
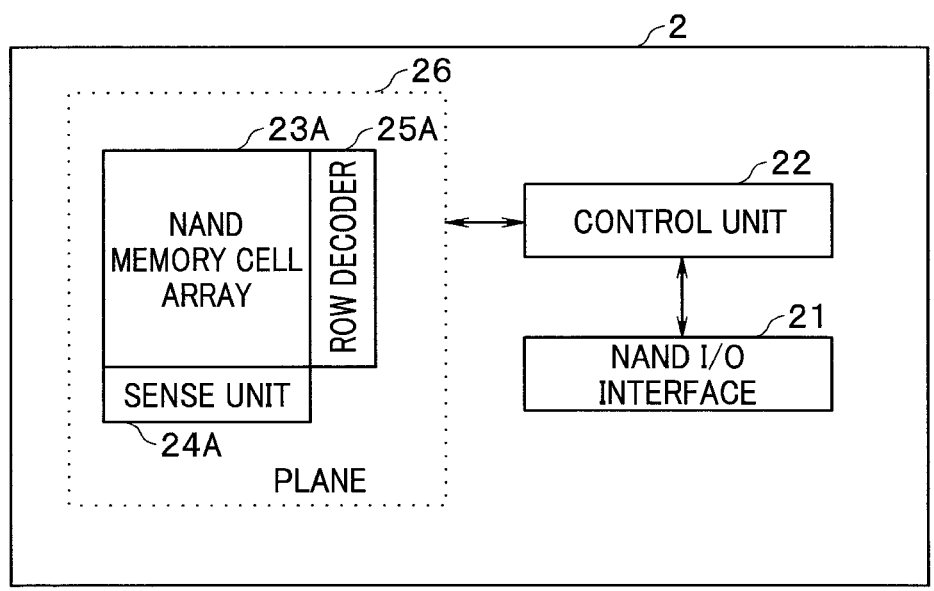
FIG. 2 is a block diagram showing a configuration example of a nonvolatile memory according to the embodiment of the present invention.

FIG. 2 is a block diagram showing a configuration example of the nonvolatile memory according to the present embodiment. The nonvolatile memory 2 includes a NAND I/O interface 21, a control unit 22, and a plane 26. The plane 26 is a unit capable of independently executing a read operation, a write operation, and an erase operation, and one or more planes 26 are arranged in the nonvolatile memory. FIG. 2 shows a case where one plane 26 is arranged in the nonvolatile memory 2. The plane 26 includes a NAND memory cell array (memory cell portion) 23A, a sense unit 24A, and a row decoder 25A. The nonvolatile memory 2 includes, for example, a semiconductor substrate (for example, a silicon substrate) of one chip.

The control unit 22 controls the operation of the nonvolatile memory 2 based on a request or the like input from the memory controller 1 via the NAND I/O interface 21. More specifically, when a write request is input, the control unit 22 controls the row decoder 25A and the sense unit 24A so as to write target data at a designated address on the NAND memory cell array 23A. When a read request is input, the control unit 22 performs control to read out target data from the NAND memory cell array 23A and output the data to the memory controller 1 via the NAND I/O interface 21.

Based on a row address input from the control unit 22, the row decoder 25A selects the NAND memory cell array 23A on a block based on a row address input from the control unit 22, and applies desired voltages to word lines.

The sense unit 24A detects data read out from the NAND memory cell array 23A in the read operation. Furthermore, the sense unit 24A temporarily stores write-target data input from the memory controller 1 and to be written into the NAND memory cell array 23A in the write operation.

(1-3. Configuration of Memory Cell Array)

Figure 3:
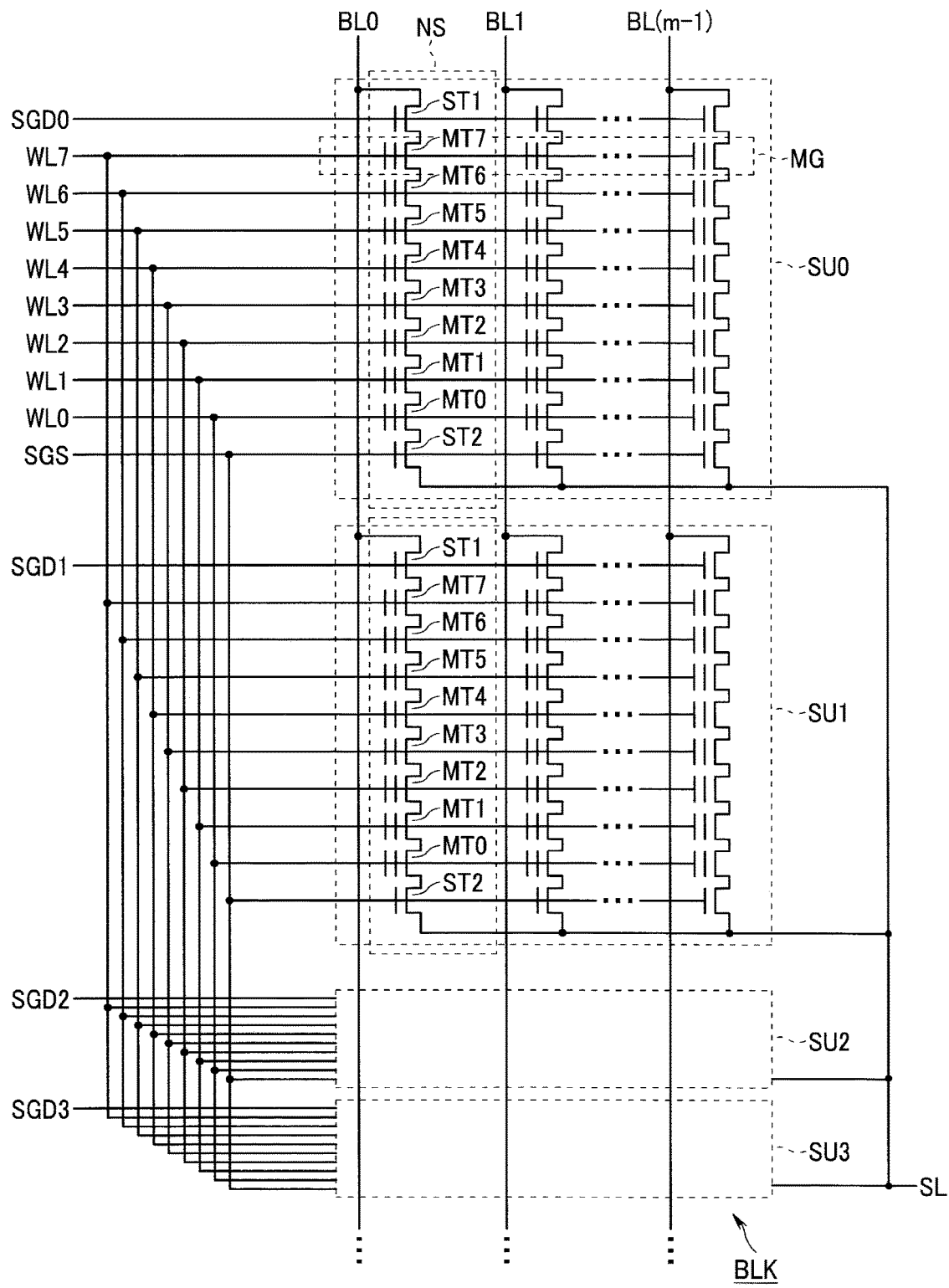
FIG. 3 is a diagram showing a configuration example of a block of a memory cell array having a three-dimensional structure.

FIG. 3 is a diagram showing a configuration example of a block of the memory cell array having the three-dimensional structure. FIG. 3 shows one block BLK out of plural blocks constituting the memory cell array having the three-dimensional structure. The other blocks of the memory cell array have configurations similar to the configuration of FIG. 3. Note that the present embodiment can be also applied to a memory cell having a two-dimensional structure.

As shown in FIG. 3, the block BLK includes, for example, four string units SU (SU0 to SU3). Each string unit SU includes plural NAND strings NS. Each of the NAND strings NS includes, for example, eight memory cell transistors MT (MT0 to MT7), and select transistors ST1 and ST2.

The number of the memory cell transistors MT is not limited to eight, and may be equal to 32, 48, 64, or 96, for example. Although each of the select transistors ST1 and ST2 is shown as one transistor on the electric circuit, each of the select transistors ST1 and ST2 may be structurally identical to the memory cell transistor. Furthermore, for example, in order to enhance the cutoff characteristic, plural select transistors may be used as each of the select transistors ST1 and ST2. Furthermore, a dummy cell transistor may be provided between the memory cell transistor MT and each of the select transistors ST1 and ST2.

The memory cell transistors MT are arranged so as to be connected to one another in series between the select transistors ST1 and ST2. A memory cell transistor MT7 on one end side is connected to one end of the select transistor ST1, and a memory cell transistor MT0 on the other end side is connected to the select transistor ST2.

The gates of the respective select transistors ST1 of the string units SU0 to SU3 are commonly connected to the select gate lines SGDO to SGD3, respectively. On the other hand, the gates of the select transistors ST2 are commonly connected to the same select gate line SGS among the plural string units SU within the same block BLK. Furthermore, gates of the memory cell transistors MT0 to MT7 in the same block BLK are commonly connected to the word lines WL0 to WL7, respectively. That is, the word lines WL0 to WL7 and the select gate line SGS are commonly connected among the plural string units SU0 to SU3 within the same block BLK, whereas the select gate lines SGD are independent of one another among the string units SU0 to SU3 even within the same block BLK.

The word lines WL0 to WL7 are connected to the gate electrodes of the memory cell transistors MT0 to MT7 constituting the NAND string NS respectively, and the memory cell transistors MTi (i=0 to n) in the respective NAND strings NS are commonly connected to one another by the same word line WLi (i=0 to n). That is, the gate electrodes of the memory cell transistors MTi on the same row within the block BLK are connected to the same word line WLi. In the following description, the NAND string NS may be simply referred to as a "string".

The NAND string NS is connected to a bit line, and each memory cell included in the NAND string NS is connected to the corresponding word line WLi. As described above, the data of the memory cells (memory cell transistors MT) in the same block BLK are erased in bulk. On the other hand, reading and writing of data are performed on every memory cell group MG (or on a page basis). In this specification, plural memory cells which are connected to one word line WLi and belong to one string unit SU are defined as a memory cell group. In the present embodiment, memory cells which are commonly connected to one word line are defined as a memory cell group MG. In the present embodiment, the nonvolatile memory 2 is a NAND memory of 3 bit/Cell, and one memory cell group MG corresponds to three pages. The 3 bits of each memory cell correspond to these 3 pages. In the present embodiment, these three pages are referred to as a Lower page (first page), a Middle page (second page), and an Upper page (third page).

In the read operation and the write operation, one word line WLi and one select gate line SGD are selected according to a physical address to select a memory cell group MG.

Figure 4:
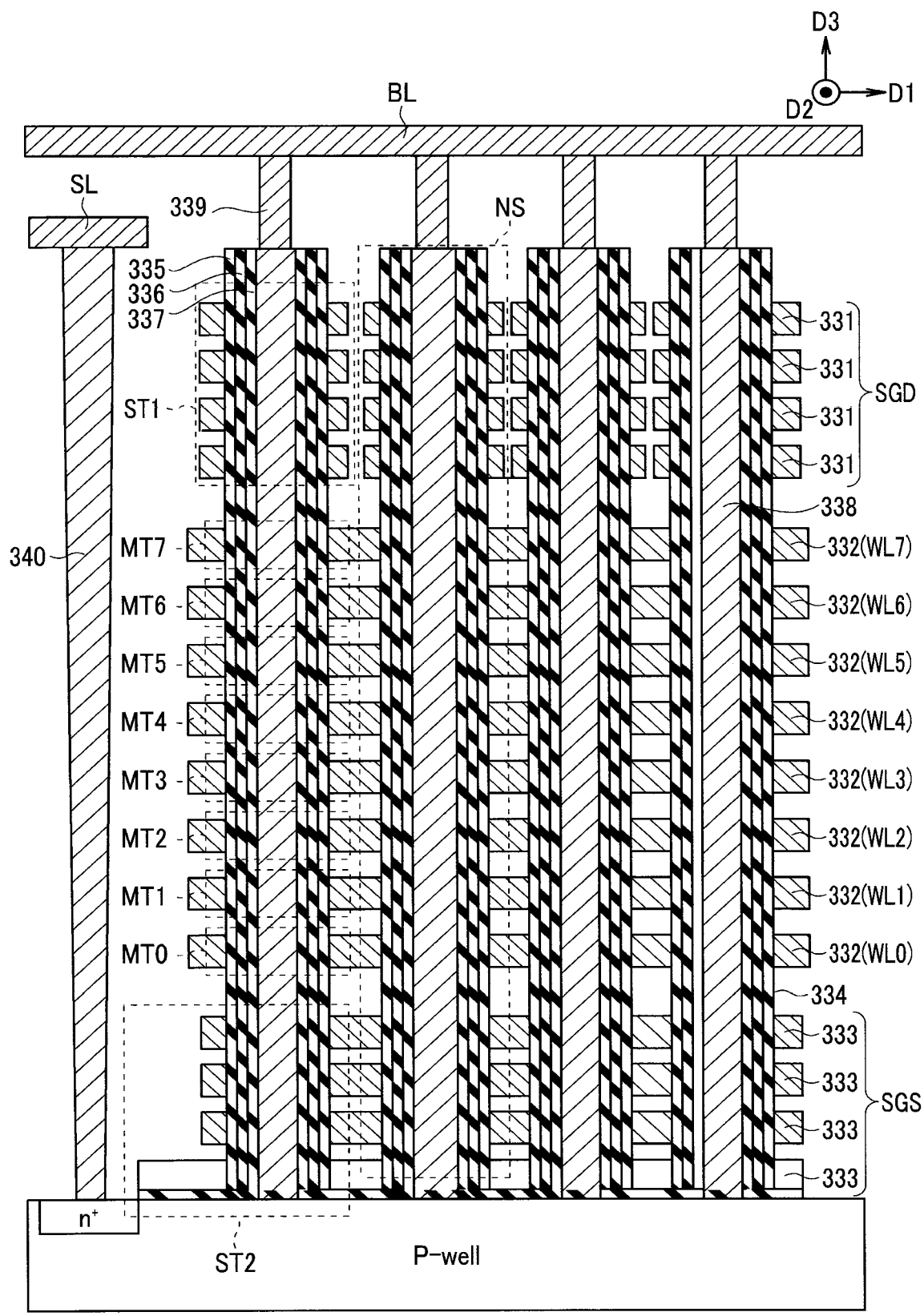
FIG. 4 is a cross-sectional view of a partial region of a memory cell array of a NAND memory having a three-dimensional structure.

FIG. 4 is a cross-sectional view of a partial region of a memory cell array of the NAND memory having the three-dimensional structure. As shown in FIG. 4, plural NAND strings NS are formed on a P-type well region (P-well). That is, plural wiring layers 333 functioning as the select gate line SGS, plural wiring layers 332 functioning as the word lines WLi, and plural wiring layers 331 functioning as the select gate line SGD are stacked on the P-type well region.

Memory holes 334 are formed so as to penetrate the wiring layers 333, 332, and 331 and reach the p-type well region. A block insulating film 335, a charge storage layer 336, and a gate insulating film 337 are sequentially, formed on the side surface of the memory hole 334, and a conductor pillar 338 is further buried in the memory hole 334. The conductor pillar 338 is formed of, for example, polysilicon, and functions as a region where a channel is formed when the memory cell transistors MT and the select transistors ST1 and ST2 included in the NAND string NS operate.

In each NAND string NS, the select transistor ST2, the plural memory cell transistors MT, and the select transistor ST1 are formed on the p-type well region. A wiring layer functioning as the bit line BL is formed above the conductor pillars 338. Contact plugs 339 configured to connect the conductor pillars 338 and the bit line BL are formed on an upper side of the conductor pillars 338.

Furthermore, an $n^+$-type impurity diffusion layer and a $p^+$-type impurity diffusion layer are formed in the surface of the p-type well region. A contact plug 340 is formed on the $n^+$-type impurity diffusion layer, and a wiring layer functioning as a source line SL is formed on the contact plug 340.

A configuration shown in FIG. 4 is repeatedly arranged in plurality in the depth direction of the paper surface of FIG. 4, and one string unit SU is formed by a group of the plural NAND strings aligned in a row in the depth direction.

(1-4 Threshold Voltage Distribution of Memory Cell Transistor)

Figures 5, 6:
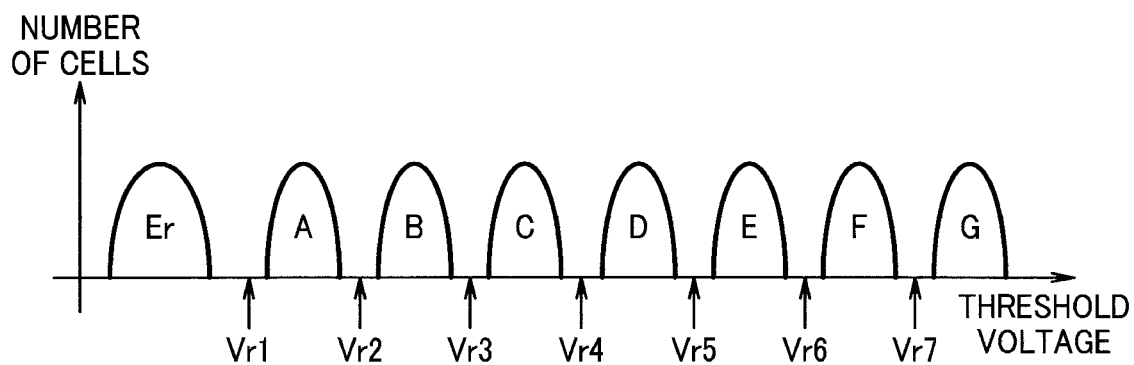
FIG. 5 is a diagram showing an example of a threshold voltage distribution according to the embodiment.
FIG. 6 is a diagram showing data coding according to the embodiment.

FIG. 5 is a diagram showing an example of a threshold voltage region according to the present embodiment. FIG. 5 shows an example of a threshold voltage distribution of the nonvolatile memory 2 of 3-bit/Cell. In the nonvolatile memory 2, information is stored with the amount of charges stored in the charge storage layer of the memory cell. Each memory cell has a threshold voltage corresponding to the amount of charges. Plural data values to be stored in the memory cell are made to correspond to plural regions of the threshold voltage (threshold voltage regions).

Eight distributions (mountain-shape) denoted by Er, A, B, C, D, E, F, and G in FIG. 5 represent eight threshold voltage distributions, respectively. As described above, each memory cell has threshold voltage distributions partitioned by seven boundaries. In FIG. 5, the horizontal axis represents the threshold voltage and the vertical axis represents the distribution of the number of memory cells (number of cells).

In the present embodiment, a region where the threshold voltage is not more than Vr1 is referred to as a region Er, a region where the threshold voltage is larger than Vr1 and not more than Vr2 is referred to as a region A, a region where the threshold voltage is larger than Vr2 and not more than Vr3 is referred to as a region B, and a region where the threshold voltage is larger than Vr3 and not more than Vr4 is referred to as a region C. Furthermore, in the present embodiment, a region where the threshold voltage is larger than Vr4 and not more than Vr5 is referred to as a region D, and a region where the threshold voltage is larger than Vr5 and not more than Vr6 is referred to as a region E, a region where the threshold voltage is larger than Vr6 and not more than Vr7 is referred to as a region F, and a region where the threshold voltage is larger than Vr7 is referred to as a region G.

Furthermore, the threshold voltage distributions corresponding to the regions Er, A, B, C, D, E, F, and G are referred to as distributions Er, A, B, C, D, E, F and G (first to eighth distributions), respectively. Vr1 to Vr7 are threshold voltages serving as the boundaries of the respective regions.

In the nonvolatile memory 2, plural data values are associated with the plural threshold voltage distributions of the memory cells, respectively. This association is called as data coding. The data coding is set in advance, and when writing (programming) data, charges are injected into the memory cell so that the threshold voltage of the memory cell is set within a threshold voltage region corresponding to a data value to be stored according to the data coding. In the read operation, a read voltage is applied to the memory cell, and the data is determined according to whether the threshold voltage of the memory cell is lower or higher than the read voltage.

FIG. 6 is a diagram showing the data coding according to the present embodiment. In the present embodiment, the eight threshold voltage distributions shown in FIG. 5 are associated with eight data values of 3 bits, respectively. The relationship between the threshold voltage and the data value of the bits corresponding to the Upper, Middle, and Lower pages is as follows.

A memory cell having a threshold voltage within the region Er is in a state where "111" is stored.
A memory cell having a threshold voltage within the region A is in a state where "101" is stored.
A memory cell having a threshold voltage within the region B is in a state where "001" is stored.
A memory cell having a threshold voltage within the region C is in a state where "011" is stored.
A memory cell having a threshold voltage within the region D is in a state where "010" is stored.
A memory cell having a threshold voltage within the region E is in a state where "110" is stored.
A memory cell having a threshold voltage within the region F is in a state where "100" is stored.
A memory cell having a threshold voltage within the region G is in a state where "000" is stored.

In this way, the state of 3-bit data of each memory cell can be represented by each of the threshold voltage regions. Note that when a memory cell is in an unwritten state (a state of "erased"), the threshold voltage of the memory cell is within the Er region. Furthermore, with respect to the signs shown here, data is changed by 1 bit between any two adjacent states like the data of "111" is stored by the Er (erased) state and the data of "101" is stored by the A state. As described above, the coding shown in FIG. 6 is a gray coding in which data is changed by 1 bit between any two adjacent regions.

With respect to FIG. 5, the case where the eight levels are discretely distributed has been described as an example. However, this state is an ideal state immediately after the write operation, for example. However, realistically, it may happen that adjacent levels overlap each other. For example, as a time elapses after the write operation, an upper end of the distribution Er and a lower end of the distribution A may overlap each other due to so-called disturb. In such a case, data are corrected by using an ECC technique, for example.

(2. Operation)

Next, a data write operation in the present embodiment will be described.

(2-1. Concept of Write Operation)

First, the write operation according to the present embodiment will be briefly described. First, the write operation roughly includes a program operation and a verify operation.

The program operation is an operation of increasing the threshold voltage by injecting electrons into the charge storage layer (or maintaining the threshold voltage by inhibiting injection). Hereinafter, the operation of increasing the threshold voltage is referred to as ["0" program] or ["0" writing], and "0" data is given to a bit line BL targeted for the "0" program. On the other hand, the operation of maintaining the threshold voltage is referred to as ["1" program], ["1" writing] or [write inhibition], and "1" data is given to a bit line BL targeted for the "1" program.

As the ["0" writing], a program operation is executed in a normal mode or a QPW mode. The normal mode is a writing mode for making the increment of the threshold voltage large in order to quickly increase the threshold voltage up to the vicinity of a target level. The QPW (quick pass write) mode is a writing mode for suppressing the increment of the threshold voltage so that the threshold voltage does not exceed the target level significantly. The program operation in each mode will be described in detail later The verify operation is an operation of reading data after the program operation to determine whether the threshold voltage of the memory cell transistor MT has reached the target level. The memory cell transistor MT having reached the target level is thereafter inhibited from being written.

By repeating the combination of the program operation and the verify operation described above, the threshold voltage of the memory cell transistor MT is increased to the target level.

Figure 7:
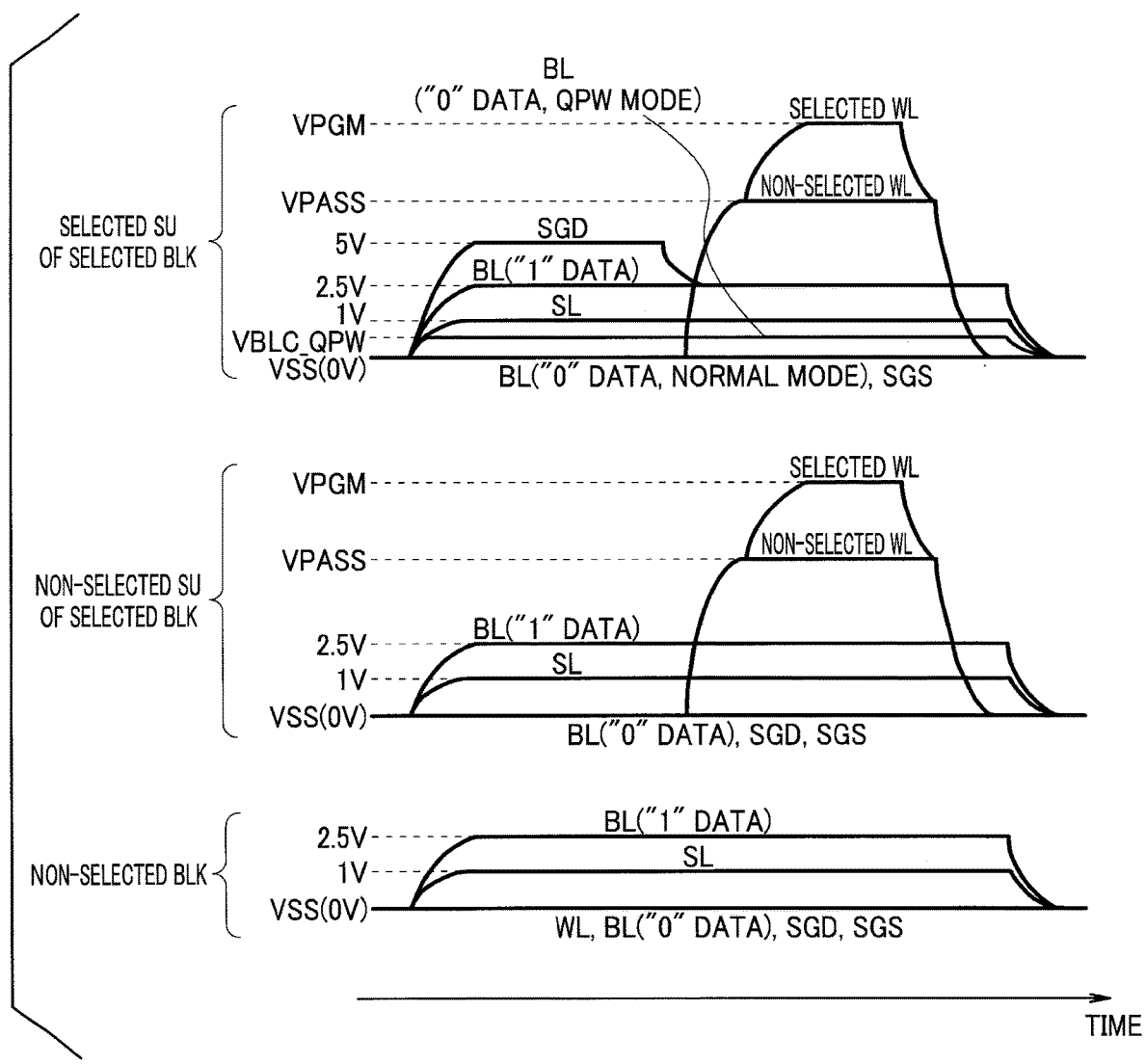
FIG. 7 is a diagram showing a potential variation of each wiring during a write operation of a general semiconductor memory device.

FIG. 7 shows the potential variation of each wiring during the program operation. As shown in FIG. 7, the sense unit 24 first transfers program data to each bit line BL. In the case of a bit line BL to which "0" data is given, when the program operation is executed in the normal mode, a ground voltage Vss (for example, 0 V) is applied as an "L" level to the bit line BL. When the program operation is executed in the QPW mode, a voltage VBLC_QPW (Vss<VBLC_QPW<VDD, for example, 0.5 V) is applied as a "QPW" level to the bit line BL. In the case of a bit line BL to which "1" data is given, an "H" level, for example, 2.5 V is applied to the bit line BL.

Furthermore, the row decoder 25 selects any block BLK and further selects any string unit SU. Then, the row decoder 25 applies, for example, 5 V to the select gate line SGD in the selected string unit SU, thereby setting the select transistor ST1 to an ON-state. On the other hand, the row decoder 25 applies the voltage Vss to the select gate line SGS, thereby setting the select transistor ST2 to an OFF-state.

Furthermore, the row decoder 25 applies the voltage Vss to the select gate lines SGD and SGS of the non-selected string units SU in the selected block BLK and the non-selected string units SU in the non-selected blocks BLK, thereby setting the select transistors ST1 and ST2 to the OFF-state.

The source line SL is set to, for example, 1 V (a potential higher than the potential of the select gate line SGS).

Thereafter, the row decoder 25 sets the potential of the select gate line SGD in the selected string unit SU of the selected block BLK to 2.5 V, for example. This potential corresponds to a voltage which turns on the select transistors ST1 corresponding to bit lines BL to which "0" data (0 V or VBLC_QPW) is applied, but cuts off the select transistors ST1 corresponding to bit lines BL to which "1" data (2.5 V) is applied.

Then, the row decoder 25 selects any word line WL in the selected block BLK, applies a voltage VPGM to the selected word line, and applies a voltage VPASS to the other non-selected word lines WL. The voltage VPGM is a high voltage for injecting electrons into the charge storage layer by a tunnel phenomenon, and VPGM>VPASS is satisfied. The state of the string unit SU at this time is shown in FIG. 8.

Figure 8:
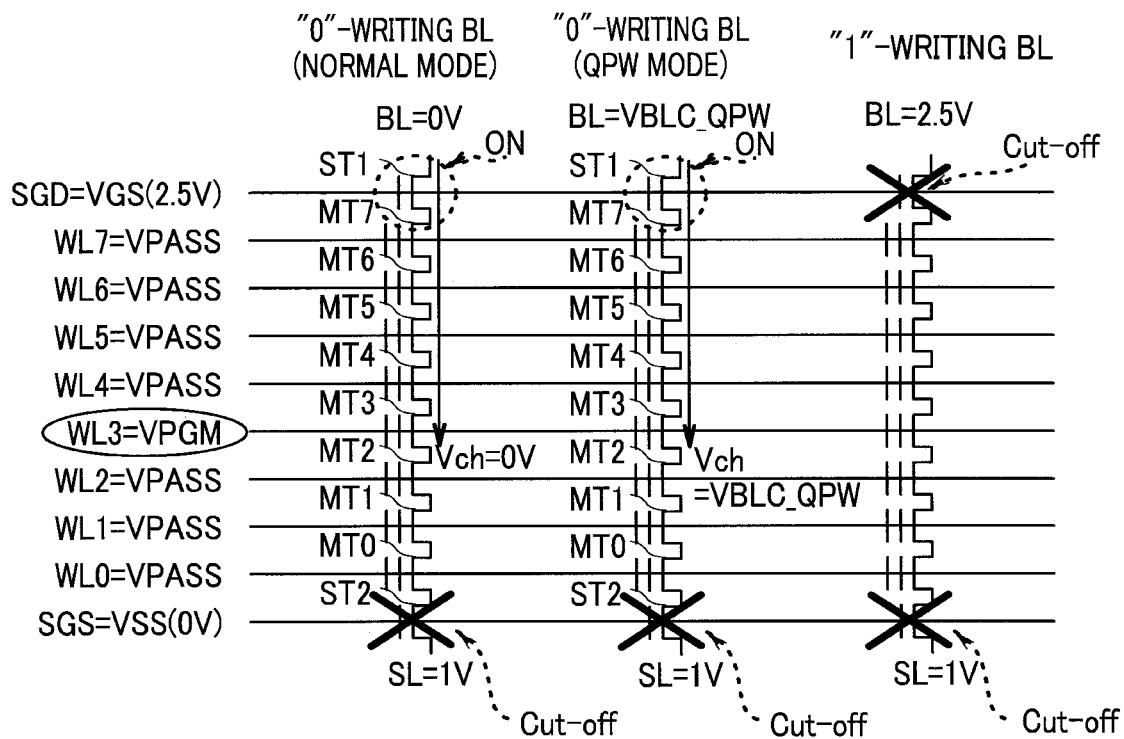
FIG. 8 is a circuit diagram showing a state of a string during the write operation.

FIG. 8 shows three NAND strings corresponding to a bit line BL targeted for the "0" writing in the normal mode, a bit line BL targeted for the "0" writing in the QPW mode, and a bit line BL targeted for the "1" writing, respectively. Furthermore, FIG. 8 shows a state when the word line WL3 is selected.

As shown in FIG. 8, the voltage VPGM is applied to the selected word line WL3, and the voltage VPASS is applied to the non-selected word lines WL0 to WL2 and WL4 to WL7.

In the NAND strings corresponding to the bit lines BL targeted for the "0" writing, the select transistors ST1 are set to the ON-state. Therefore, the channel potential Vch of the memory cell transistors MT3 in the normal mode out of the memory cell transistors MT3 connected to the selected word line WL3 is equal to 0 V. Furthermore, the channel potential Vch of the memory cell transistors MT3 in the QPW mode out of the memory cell transistors MT3 connected to the selected word line WL3 is equal to VBLC_QPW. That is, the potential difference between the gate and the channel is large, so that electrons are injected into the charge storage layers, and the threshold voltages of the memory cell transistors MT3 are increased. At this time, since 0<VBLC_QPW is set, the increment of the threshold voltage of the memory cell transistors MT3 in the QPW mode is smaller than the increment of the threshold voltage of the memory cell transistors MT3 in the normal mode.

The program operation is executed in the QPW mode on the memory cell transistor MT3, the threshold voltage of which has increased to the vicinity of a target level while the program operation is executed in the normal mode on the memory cell transistor MT3, the threshold voltage of which has not increased to the vicinity of the target level, whereby it is possible to realize two kinds of writing characteristics by using one program pulse. As a result, the threshold voltage distribution width can be narrowed without reducing the step width of the voltage VPGM, so that a time period required for the entire write operation can be reduced.

In the NAND strings corresponding to the bit lines BL targeted for the "1" writing, the select transistors ST1 are set to the cutoff state. Therefore, the channels of the memory cell transistors MT3 connected to the selected word line WL3 are respectively brought into an electrically-floating state, and the channel potential Vch is increased near to the voltage VPGM due to capacitive coupling with the word line WL. That is, the potential difference between the gate and the channel is lowered, so that electrons are not injected into the charge storage layers and thus the threshold voltages of the memory cell transistors MT3 are maintained (the threshold voltage does not vary from the current distribution level to a higher distribution level).

(2-2. Specific Example of Write Operation)

The write operation of the present embodiment will be described more specifically with reference to FIG. 9 and FIG. 10. FIGS. 9 and 10 show a case in which data are written by repeating the combination of the program operation and the verify operation at 19 times. This repeating operation is called as "loop".

FIG. 9 shows the target levels of the verify operation executed in each loop. As shown in FIG. 9, in first and second loops, the verify operation is executed while targeting only the "A" level. That is, a voltage VfyA is applied to the selected word line WL during the verify operation, and voltages VfyB to VfyG are not applied. In subsequent third and fourth loops, the verify operation is executed while targeting the "A" level and the "B" level. That is, during the verify operation, the voltages VfyA and VfyB are sequentially applied to the selected word line WL, and the voltages VfyC to VfyG are not applied.

In fifth and sixth loops, the verify operation is executed while targeting the "A" level, "B" level, and "C" level. That is, during the verify operation, the voltages VfyA, VfyB, and VfyC are sequentially applied to the selected word line WL, and the voltages VfyD to VfyG are not applied. The verify operation targeting the "A" level is completed in the sixth loop. This is because it is statistically required that the program to the "A" level is almost completed with a loop number of six loops, for example.

In seventh and eighth loops, the verify operation is executed while targeting the "B" level, the "C" level, and the "D" level. That is, during the verify operation, the voltages VfyB, VfyC, and VfyD are sequentially applied to the selected word line WL. The verify operation targeting the "B" level is completed by an eighth write operation. Furthermore, in ninth and tenth loops, the verify operation is executed while targeting the "C" level, the "D" level, and the "E" level. That is, the voltages VfyC, VfyD, and VfyE are sequentially applied to the selected word line WL during the verify operation. The verify operation targeting the "C" level is completed in the tenth loop.

Thereafter, the write operation up to the "G" level is likewise executed and the loop is repeated up to 19 times at maximum.

In the verify operation in each loop, two verify operations including low level verify and high level verify are executed. The high level verify is a verify operation for determining whether the threshold voltage has reached a target level. Hereinafter, at the levels of "A" to "G", the voltages to be applied to the selected word line WL in the high level verify operation are represented by VfyA (H) to VfyG (H), respectively. The low level verify is a verify operation for determining whether the threshold voltage approaches the vicinity of the target level. Hereinafter, at the levels of "A" to "G", the voltages to be applied to the selected word line WL in the low level verify operation are represented by VfyA (L) to VfyG (L), respectively.

VfyA (H) to VfyG (H) may have the same values as the voltages Vr1 to Vr7 used as the boundaries of the above-mentioned regions Er to G, for example.

At each level, the voltage Vfy (L) applied to the selected word line WL in the low level verify is set to a value which is lower than the voltage Vfy (H) applied to the selected word line in the high level verify by a predetermined value (for example, about 0.2 V).

Note that as the low level verify and the high level verify, the sense unit 24 may be caused to execute the read operation while the voltage Vfy (L) and the voltage Vfy (H) described above are continuously applied to the selected word line WL by the row decoder 25. Alternatively, as the low level verify, the sense unit 24 may be caused to execute the read operation after changing the operation parameter of the sense amplifier circuit 24 (for example, shortening a sense time) while the voltage Vfy (H) is applied to the selected word line WL by the row decoder 25. In this case, the voltage Vfy (H) may be applied to the selected word line WL in the low level verify and the high level verify subsequent to the low level verify, and thus it is unnecessary that the voltage to be applied to the selected word line is changed between the low level verify and the high level verify.

FIG. 10 corresponds to FIG. 9, and shows the state of the bit line corresponding to the target level of the threshold voltage in each loop. In FIG. 10, the notation "1" means that "1" data is given to the corresponding bit line BL, and the notation "0" means that "0" data is given.

As shown in FIG. 10, when the threshold voltage of the memory cell transistor MT should be kept at the "Er" level, "1" data is given to the bit line BL over all the loops. That is, the select transistor ST1 is set to the cutoff state at all times during the write operation.

When the target level of the threshold voltage is the "A" level, that is, for the memory cell transistor MT, the threshold voltage of which should be increased from a value within the "Er" level to a value within the "A" level, the "0" program operation is executed from the first loop to the sixth loop. This corresponds to loops in which the verify operation for the "A" level is executed. "0" data is given to the bit line BL until the memory cell transistor MT has passed the verify, and "1" data is given after the memory cell transistor MT has passed the verify. In the seventh and subsequent loops, the threshold voltage of the corresponding memory cell transistor MT is deemed to have reached the "A" level, and "1" data is also given to the bit line BL to inhibit further program operation thereto.

When the target level is the "B" level, that is, for the memory cell transistor MT, the threshold voltage of which should be increased from a value within the "Er" level to a value within the "B" level, the "0" program operation may be executed from the first loop to the eighth loop. This corresponds to loops in which the verify operation for the "B" level is executed. In the third loop to the eighth loop, "0" data is given to the bit line BL until the memory cell transistor MT has passed the verify, and "1" data is given after the memory cell transistor MT has passed the verify. In the ninth and subsequent loops, the threshold voltage of the corresponding memory cell transistor MT is deemed to have reached the "B" level, and "1" data is also given to the bit line BL to inhibit further program operation thereto.

After that, the program operations from the "C" level to the "G" level are likewise executed.

Figure 11:
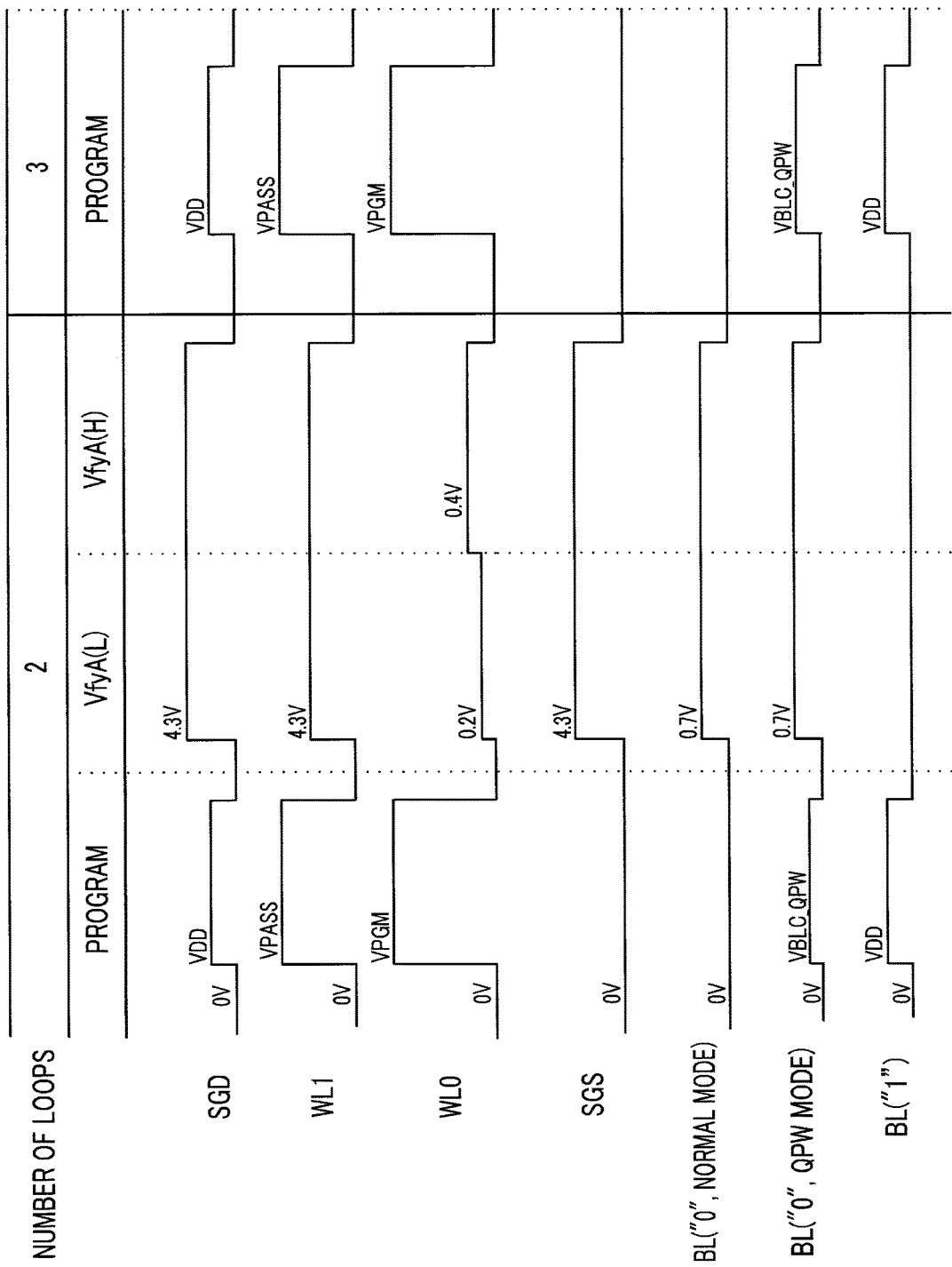
FIG. 11 is a timing chart showing timings of voltages of selected word lines and bit lines during the write operation.

The state of the potential of each wiring during the above operation is shown in FIG. 11. FIG. 11 shows the changes over time of the potential of the select gate line SGD, the potential of the selected word line WL (denoted by WL0 in FIG. 11), the potential of the non-selected word line (denoted by WL1 in FIG. 11), the gate potential of the select gate line SGS, the potential of the bit line BL in which the "0" program operation in the normal mode is executed (denoted by BL("0", normal mode) in FIG. 11), the potential of the bit line BL in which the "0" program operation in the QPW mode is executed (denoted by BL("0", QPW mode) in FIG. 11), and the potential of the bit line BL in which the "1" program operation is executed (denoted by BL("1") in FIG. 11) in the program operation of the second loop and the third loop.

In the first loop (not shown), the potential of BL("1") is set to the bit lines BL corresponding to memory cell transistors MT in which the "Er" level should be maintained, and the potential of BL ("0", normal mode) is set to the bit lines BL corresponding to memory cell transistors MT, the threshold voltages of which should be increased to values within the "A" level to the "G" level. In the first loop, after the program operation is executed with a predetermined program voltage, bit lines BL corresponding to memory cell transistors MT targeting the "A" level are selected by precharging the bit lines BL to, for example, 0.7 V, and the low level verify and the high level verify for the "A" level are performed.

In the first loop, the threshold voltage of the memory cell transistor MT targeting the "A" level increases, and according to the degree of the increase, the memory cell transistor MT is classified into one of a transistor having failed the low level verify, a transistor having passed the low level verify, but failed the high level verify, and a transistor having passed the high level verify.

In the second loop, the "0" program operation is executed on memory cell transistors MT having failed the high level verify for the "A" level and memory cell transistors MT targeting the "B" level to "G" level. At this time, for the transistor having passed the low level verify for the "A" level in the first loop, the "0" program operation is executed in the QPW mode. That is, the voltage VPGM is applied to the selected word line WL0 and the voltage VBLC_QPW (for example, 0.5 V) is applied to the bit lines BL("0", QPW mode).

The "0" program operation is executed in the normal mode on the transistors having failed the low level verify for the "A" level and the memory cell transistors MT of the "B" level to the "G" level. That is, the voltage VPGM is applied to the selected word line WL0 and, for example, the voltage VSS (=0 V) is applied to the bit lines BL ("0", normal mode). Furthermore, the "1" program operation is executed on the memory cell transistors MT in which the "Er" level should be maintained, and the memory cell transistors MT having passed the high level verify for the "A" level. That is, for example, the voltage VDD (=2.5 V) is applied to the bit lines BL ("1").

During the program operation, the select gate line SGD is set to the voltage VDD (=2.5 V), and the select transistor ST1 is set to the conduction state or the cutoff state depending on the relationship with the voltage (Vss, VBLC_QPW, VDD) of the bit line BL. The select gate line SGS is fixed to 0 V, and the select transistor ST2 is set to the cutoff state.

Following the program operation, the verify operation (the low level verify and the high level verify) for the "A" level is executed. First, in the low level verify, the bit lines corresponding to the memory cell transistors MT targeting the "A" level out of the bit lines BL ("0", normal mode), and the bit lines ("0", QPW mode) are precharged to, for example, 0.7 V, and the low level verify voltage VfyA (L) (=0.2 V) is applied to the selected word line WL0. Then, the low level verify for the "A" level is performed.

Subsequently, in the high level verify, the high level verify voltage VfyA (H) (=0.4 V) is applied to the selected word line WL0 while the voltage of the bit lines is still kept to that in the low level verify. Then, the high level verify for the "A" level is performed.

The memory cell transistors MT targeting the levels other than the "A" level and the memory cell transistors MT having passed the high level verify for the "A" level in the first loop are not subject to the verify for the "A" level. Accordingly, the bit lines BL corresponding to these memory cell transistors MT are fixed to 0 V through the low level verify and the high level verify. Furthermore, both of the select gate lines SGD and SGS are fixed to 4.3 V, and both the select transistors ST1 and ST2 are set to the conductive state.

In the program operation of the third loop, like the second loop, the "0" operation is executed on the memory cell transistors MT having failed the verify operation (high level verify) for the "A" level and the memory cell transistors targeting the "B" level to the "G" level. At this time, the voltage VPGM to be applied to the selected word line WL is stepped up. Like the second loop, the "0" program operation is executed in the QPW mode on the memory cell transistors having passed the low level verify for the "A" level.

When the program operation terminates, as in the case of the second loop, the verify operation (the low level verify and the high level verify) for the "A" level is executed. Subsequently, the verify operation (the low level verify and the high level verify) is also performed for the "B" level. That is, in each loop, two verify operations (the low level verify and the high Level verify) are executed for one level. For example, in the third loop, the "A" level and the "B" level are verify targets, and thus the verify operation of 2×2=4 times is executed.

The same operation as described above is executed while stepping up the voltage VPGM to be applied to the selected word line WL from the fourth loop to the sixteenth loop in which the verify of the "F" level is completed.

Figure 12:
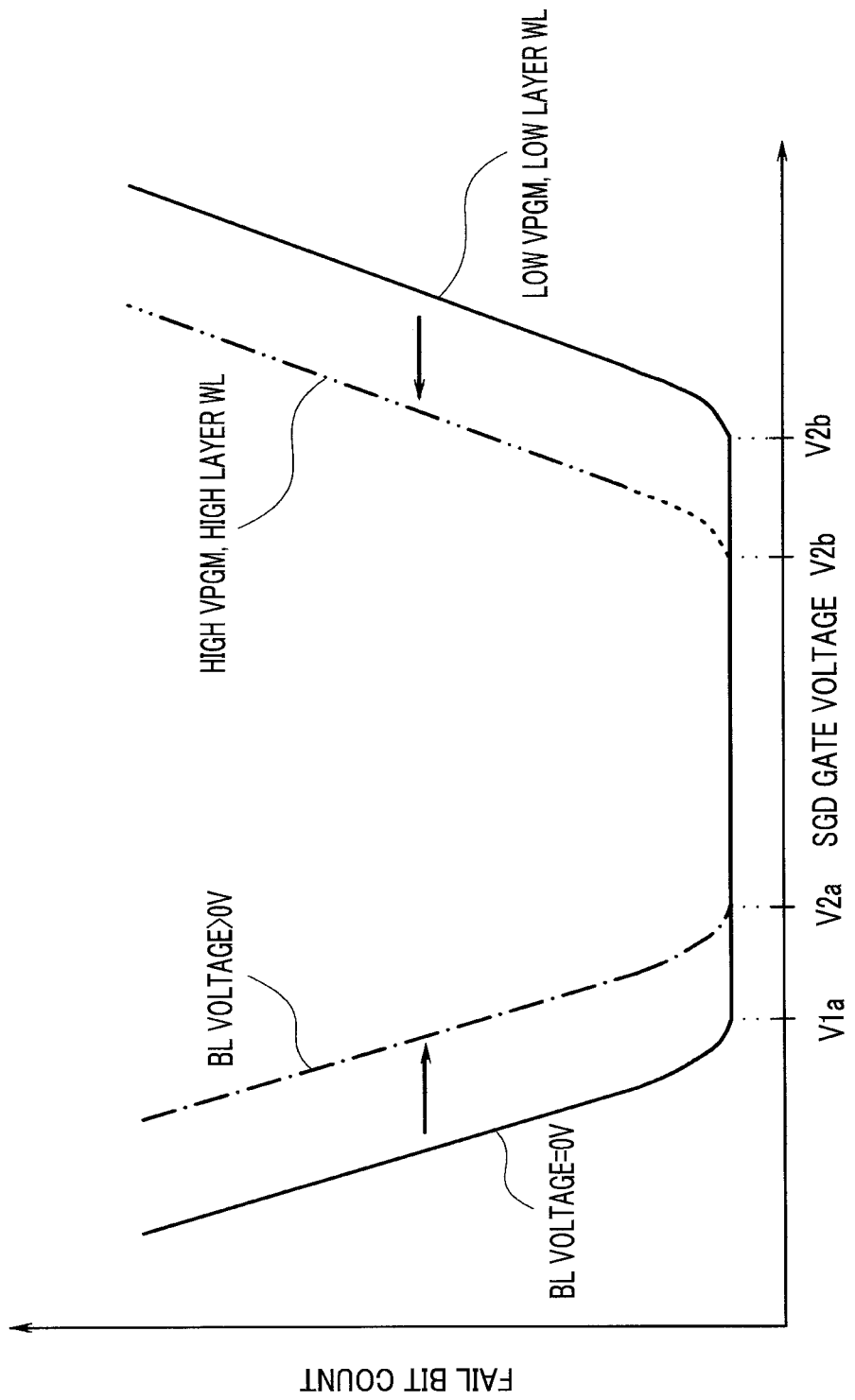
FIG. 12 is a diagram showing the relationship between a select gate line voltage VSGD and the number of fail bits.

Here, the relationship between the voltage VSGD of the select gate line SGD and the number of fail bits of the memory cell transistors MT will be described with reference to FIG. 12. In FIG. 12, the horizontal axis represents the voltage VSGD of the select gate line SGD, and the vertical axis represents the number of fail bits of the memory cell transistors MT. In general, in a region where the VSGD is low, voltage transfer of the selected bit line BL becomes difficult, so that when the voltage decreases below a certain voltage value, the number of fail bits tends to increase. A voltage Va at which the number of fail bits starts to increase depends on the voltage applied to the selected bit line BL, and the voltage Va also increases as the applied voltage increases.

When two modes are used in the program operation as described above, a voltage Va1 at which the number of fail bits starts to decrease in the normal mode in which the voltage applied to the selected bit line BL is equal to 0 V and a voltage Va2 at which the number of fail bits starts to decrease in the QPW mode in which the voltage VBLC_QPW (0<VBLC_QPW) is applied to the selected bit line BL are different from each other. That is, the voltage Va at which the number of fail bits starts to decrease is higher in the QPW mode than the voltage Va in the normal mode (voltage Va1<voltage Va2). Therefore, when the program operation is executed in the QPW mode, it is necessary to set the gate voltage VSGD to be equal to or higher than the voltage Va2 in order to secure reliability.

On the other hand, in a region where the VSGD is high, the boost potential of a non-selected memory cell transistor MT leaks, so that the "0" writing may also be performed on a write-inhibited memory cell transistor MT. Therefore, when the voltage exceeds a certain voltage value, the number of fail bits tends to increase. A voltage Vb at which the number of fail bits starts to increase depends on the voltage VPGM applied to the selected word line WL in the program operation. That is, since the voltage VPGM during the write operation increases as the target level of the threshold voltage increases, the voltage Vb decreases. For example, a voltage Vb1 at which the number of fail bits starts to increase when the voltage VPGM is applied in the first loop and a voltage Vb2 at which the number of fail bits starts to increase when the voltage VPGM is applied in the nineteenth loop are different from each other, and the value of Vb in the nineteenth loop is smaller (voltage Vb2<voltage Vb1).

As described above, in the three-dimensional memory cell array having the vertical channel structure, the channels of the select transistors ST1 and ST2 are formed of polysilicon, and an MONOS (metal oxide-nitride-oxide silicon) structure is used for the gate. This three-dimensional memory cell array has a worse S factor than a two-dimensional memory cell array using select transistors ST1 and ST2 in which the channels are formed of single crystal silicon and the gates are formed of only tunnel oxide film. Therefore, the dispersion of the threshold voltage of the select transistor ST1 becomes large, and the voltage transfer efficiency is greatly influenced, so that the voltage Vb tends to decrease more greatly as the word line WL is located in a higher layer.

As described above, the lower limit value Va of the voltage VSGD of the select gate line SGD which can reduce the number of fail bits and thus secure reliability is increased by using the QPW mode. Furthermore, as the voltage VPGM to be applied to the selected word line WL increases, the upper limit value Vb of the voltage VSGD which can reduce the number of fail bits and thus secure reliability decreases. That is, a region of the voltage VSGD where reliability can be secured (a voltage VSGD margin region, Va<voltage VSGD<Vb) becomes smaller.

On the other hand, at the highest target threshold voltage level, no problem occurs even when the threshold voltage distribution is spread in a direction to a higher side (no overlapping of threshold voltage distributions occurs because no next level exists.). Accordingly, at the "G" level, it is appreciated that no problem occurs even when the program operation is executed only in the normal mode without use of the QPW mode.

Therefore, in the present embodiment, by performing the program operation only in the normal mode for only the "G" level which is the highest target threshold voltage level, the lower limit value Va of the voltage VSGD of the select gate line SGD which can secure reliability can be lowered, and the voltage VSGD marine region is spread in a direction to a lower voltage side. By utilizing the spread margin region, the voltage to be applied to the select gate line SGD in the write operation is set to a smaller value than the voltage in the write operation before the "F" level.

Figure 13:
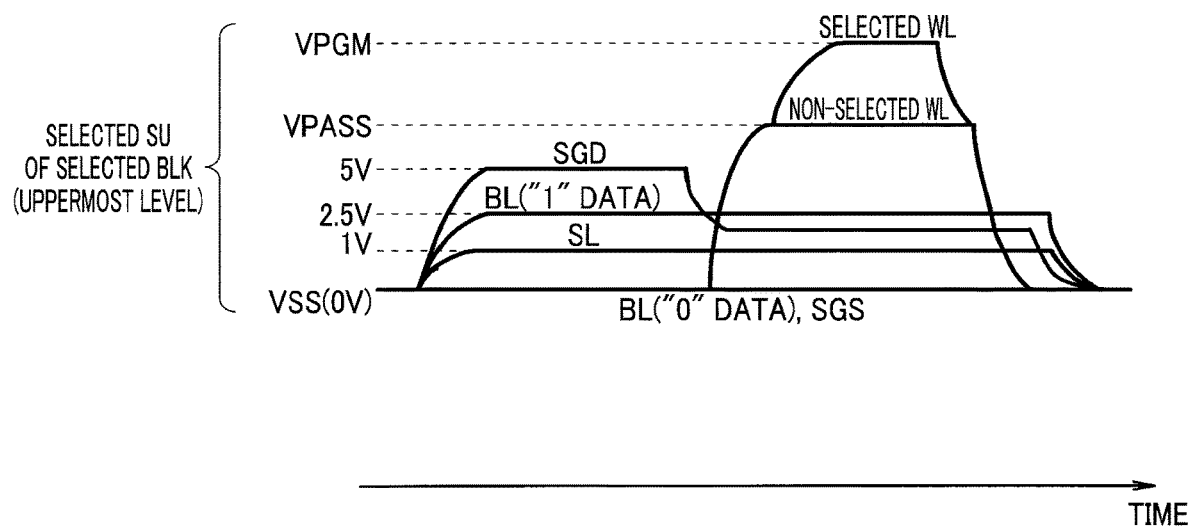
FIG. 13 is a diagram showing a potential variation of each wiring during the write operation of an uppermost threshold voltage level in a semiconductor memory device according to the present embodiment.

FIG. 13 shows the potential variation of each wiring in the write operation of the "G" level which is the highest threshold voltage level. Only a selected SU of a selected BLK is shown in FIG. 13. The potential variations of the wirings of non-selected SU of the selected BLK and non-selected BLK are similar to the potential variations shown in FIG. 7, and thus description on the potential variations is omitted. The ground voltage Vss (for example, 0 V) is applied as an "L" level to bit lines BL to which "0" data is given, and an "H" level, for example, 2.5 V is applied to bit lines BL to which "1" data is given.

The row decoder 25 selects any block BLK and further selects any string unit SU. Then, the row decoder 25 applies, for example, 5 V to the select gate line SGD in the selected string unit SU to set the select transistor ST1 to the ON-state. On the other hand, the row decoder 25 applies the voltage Vss to the select gate line SGS to set the select transistor ST2 to the OFF-state. The source line SL is set to, for example, 1 V (a potential higher than the potential of the select gate line SGS).

Thereafter, the row decoder 25 sets the potential of the select gate line SGD in the selected string unit SU in the selected block BLK to, for example, 2.3 V. This potential is a value lower than the potential (2.5 V, for example) of the select gate line SGD in the write operation up to the "F" level, and also is a voltage which turns on the select transistors ST1 corresponding to bit lines BL to which "0" data (0 V) is given, but cuts off the select transistors ST1 corresponding to bit lines BL to which "1" data (2.5 V) is given.

The row decoder 25 selects any word line WL in the selected block BLK, applies the voltage VPGM to the selected word line, and applies the voltage VPASS to the other non-selected word lines WL.

Figure 14:
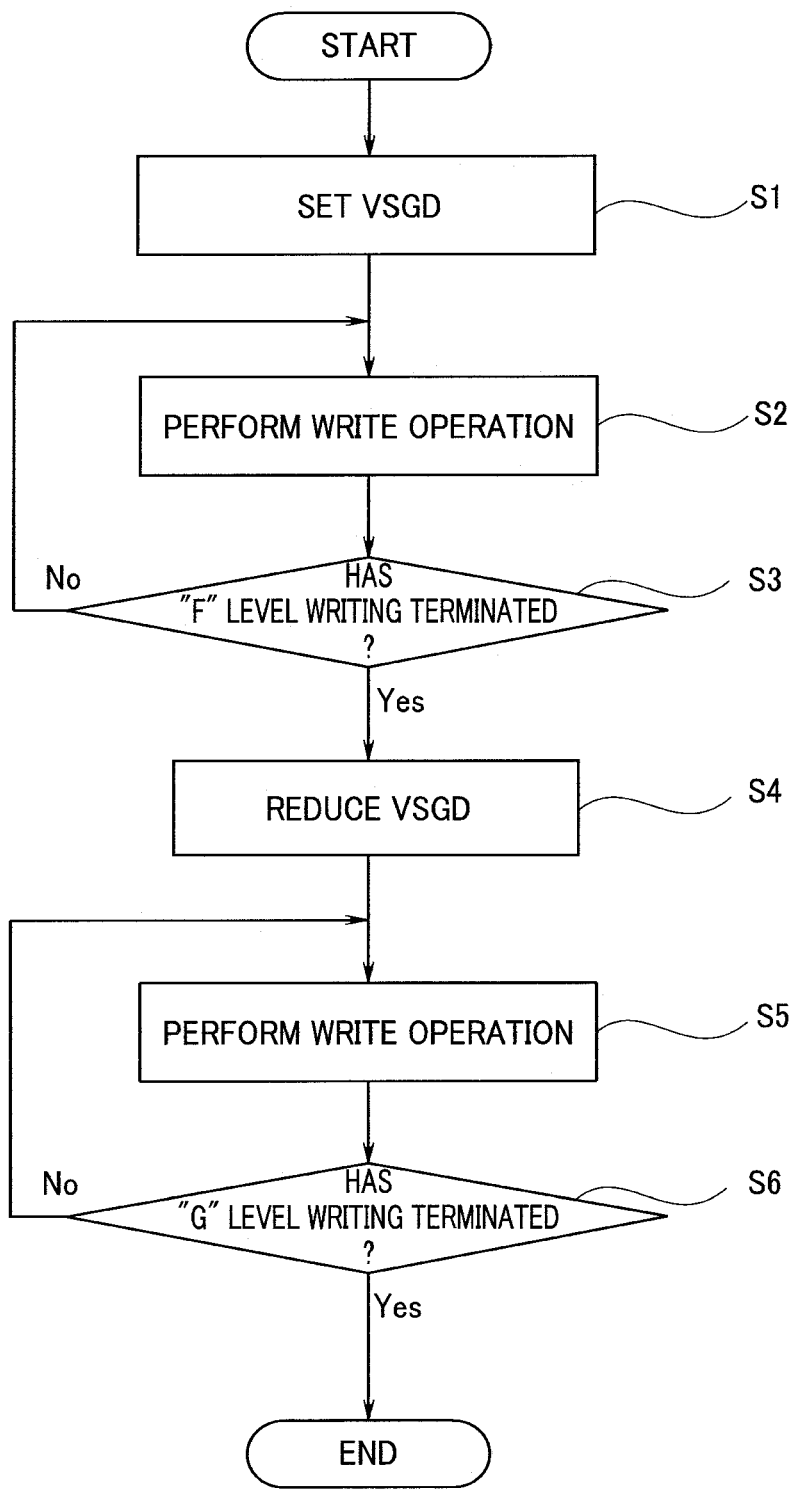
FIG. 14 is a flowchart showing an example of the procedure of the write operation in the present embodiment.

Next, the write operation in the present embodiment will be described with reference to FIG. 14. FIG. 14 is a flowchart showing an example of the procedure of the write operation in the present embodiment. First, the potential (VSGD) of the select gate line SGD in the write operation is initialized (S1). The potential set in S1 is the potential used for the write operation from the "A" level as a lowest target threshold voltage level to the "F" level as a second highest target threshold voltage level just below a highest target threshold voltage level. In the case of the above example, VSGD=2.5 V is set.

Subsequently, the set write operation is executed in order from the first loop (S2). In the write operation of S2, the program operation using both the normal mode and the QPW mode is executed.

In the verify operation in each loop, when it is determined that the write operation for the "F" level has terminated (S3, Yes), the potential (VSGD) of the select gate line SGD is lowered by a predetermined amount (S4). In the case of the example shown in FIG. 9, it is determined that the writing to the "F" level has terminated in the verify operation of the sixteenth loop. Therefore, before entering the seventeenth loop, the set potential of the select gate line SGD in the program operation is changed.

On the other hand, when it is determined that the writing to the "F" level has not terminated (S3, No), the processing returns to S2 to continue the set write operation.

In S4, when the change of the potential (VSGD) of the select gate line SGD is completed, the write operation for the subsequent loops is executed (S5). Since the program operation in S5 is executed on the highest level "G" level, only the normal mode is executed, and the QPW mode is not executed.

In the verify operation in S5, when it is determined that the writing to the "G" level has terminated (S6, Yes), the write operation on the NAND memory cell array 23 is terminated. When it is determined that the writing to the "G" level has not terminated (S6, No), the processing returns to S5 to continue the set write operation.

As described above, according to the present embodiment, when the write operation is executed on plural memory cell transistors MT that can be set to any one of plural different threshold voltages, the write operation on the highest target level is executed after writing to a second highest target level just below the highest target level terminates and then the potential (VSGD) of the select gate line SGD is lowered by a predetermined amount. Accordingly, it is possible to prevent the increase in the number of fail bits which is caused by lowering of the region of the upper limit Vb of the voltage VSGD that can ensure reliability as the voltage VPGM applied to the selected word line WL increases in the program operation, and enhance the reliability of the semiconductor memory device.

Furthermore, in the write operation of the highest target level after the writing to the second highest target level just below the highest target level terminates, by performing the program operation only in the normal mode, the lower limit Va of the voltage VSGD which can secure the reliability can be lowered, and the voltage VSGD margin region can be spread in the direction to the lower voltage side. Therefore, even when the potential (VSGD) of the select gate line SGD is lowered by a predetermined amount, it is possible to set the potential to a value higher than the lower limit Va of the voltage VSGD that can ensure reliability.

The upper limit voltage Vb of the voltage VSGD that can ensure reliability also depends on the voltage (=VDD) to be applied to the bit line BL corresponding to the write-inhibited memory cell transistor MT in the write operation, and the voltage Vb decreases as VDD is lower. On the other hand, according to the present embodiment, since the potential of the select gate line SGD can be lowered after the program operation for the second highest target level just below the highest target level terminates, VDD can be set to a low value, and the power consumption can be reduced.

In the three-dimensional memory cell array having the vertical channel structure, the upper limit voltage Vb of the voltage VSGD which can secure reliability tends to decrease more greatly as the word line WL is located in a higher layer. Therefore, the decrement of the potential (VSGD) of the select gate line SGD may be determined according to the position of the word line WL in the vertical direction when the potential (VSGD) of the select gate line SGD is lowered after the writing to the second highest target level just below the highest target level terminates. For example, with respect to the word lines WL located from the lowermost layer until a predetermined layer, the decrement of VSGD may be set to 0.2 V, and with respect to the word lines WL located in the predetermined layer and higher layers above the predetermined layer, the decrement of VSGD may be set to 0.5 V. Plural stages may be provided for the decrement instead of two stages.

The nonvolatile memory in which one plane is arranged as shown in FIG. 2 has been described above. However, the present embodiment can be also applied to a nonvolatile memory in which two or more planes are arranged.

Figure 15:
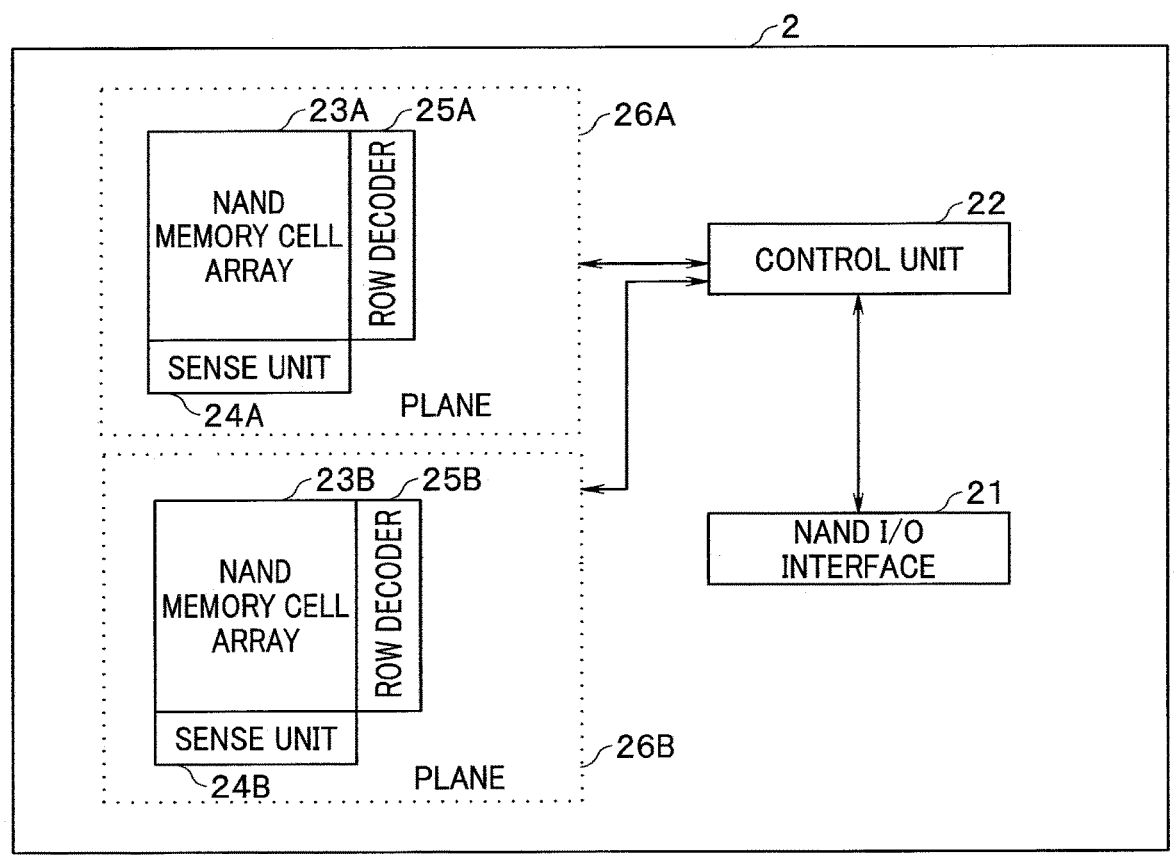
FIG. 15 is a block diagram showing a configuration example of a nonvolatile memory according to a modification.

FIG. 15 is a block diagram showing a configuration example of a nonvolatile memory according to a modification. FIG. 15 shows a case where two planes 26A and 26B are arranged in the nonvolatile memory 2. The plane 26B includes a NAND memory cell array (memory cell portion) 23B, a sense unit 24B, and a row decoder 25B. The plane 26A and the plane 26B have similar configurations, and can perform the read operation, the write operation, and the erase operation independently of each other. The read operation, the write operation, and the erase operation for the plane 26A and the plane 26B are executed by the control unit 22.

Figure 16:
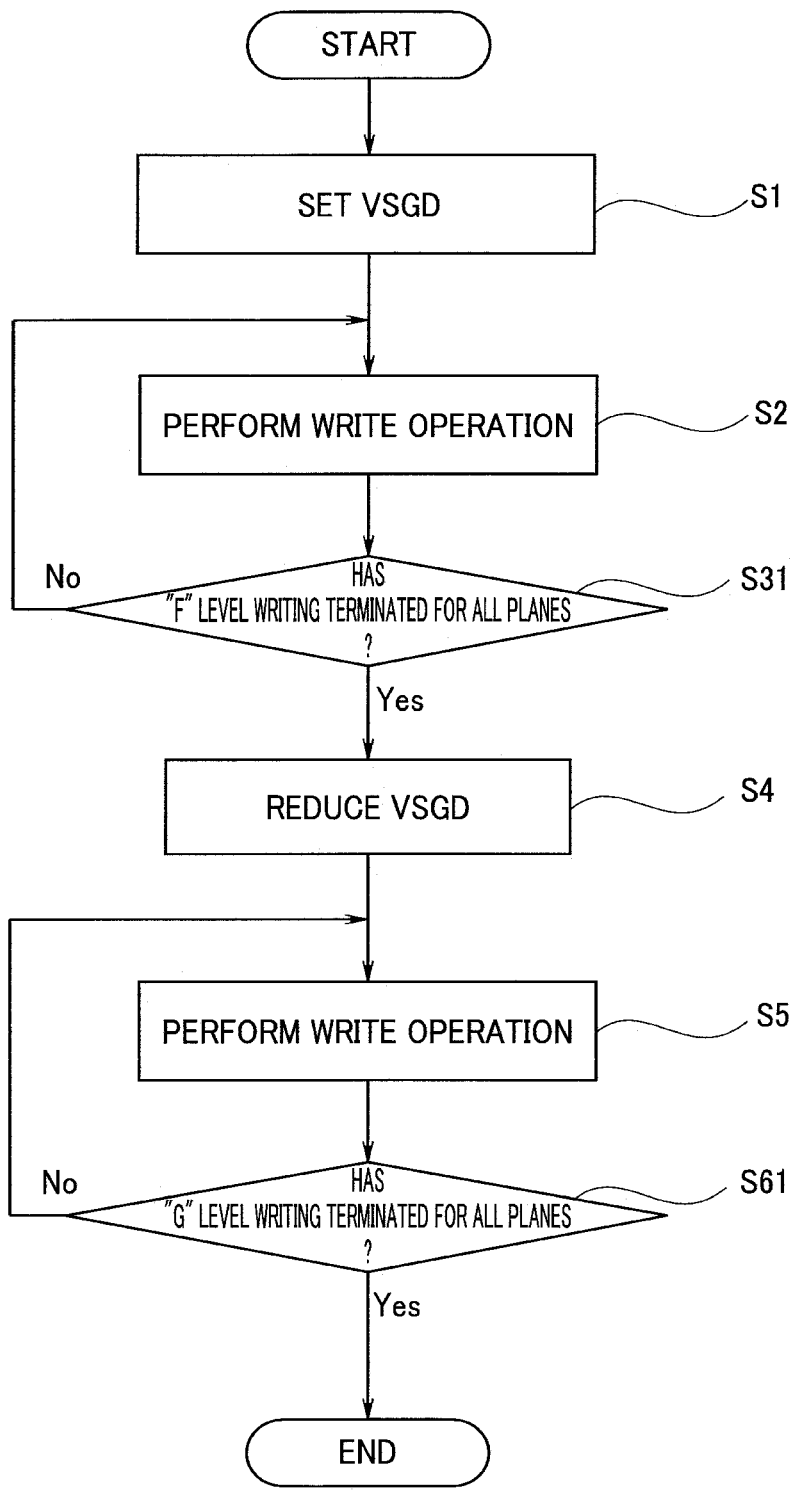
FIG. 16 is a flowchart showing an example of the procedure of a write operation in the modification.

The write operation on a nonvolatile memory having plural planes as shown in FIG. 15 will be described with reference to FIG. 16. FIG. 16 is a flowchart showing an example of the procedure of the write operation in the modification of the present embodiment. In the procedure of FIG. 16, steps similar to the steps of FIG. 14 are represented by the same reference signs.

First, the potential (VSGD) of the select gate line SGD in the write operation is initialized for all the planes (S1). Subsequently, the set write operation is executed successively from the first loop for all the planes (S2). In the write operation of S2, the program operation using both the normal mode and the QPW mode is executed.

When it is determined that the writing to the "F" level has terminated for all the planes (S31, Yes), the potential (VSGD) of the select gate line SGD is lowered by a predetermined amount (S4). On the other hand, when it is not determined that the writing to the "F" level has terminated for all the planes (S3, No), the processing returns to S2 to continue the set write operation. For example, when it is determined for the plane 26A that the writing to the "F" level has terminated in the verify operation of the sixteenth loop, whereas it is determined for the plane 26B that the writing to the "F" level has not terminated in the verify operation of the sixteenth loop, the processing does not progress to S4, and returns to S2 to execute the write operation of the seventeenth loop.

In S4, when the change of the potential (VSGD) of the select gate line SGD is completed for all the planes, the write operation for the subsequent loops is executed (S5). Since the program operation in S5 is executed for the uppermost "G" level, the normal mode is executed, but the QPW mode is not executed.

In the verify operation in S5, when it is determined that the writing to the "G" level has terminated for all the planes (S61, Yes), the write operation on the NAND memory cell array 23 is terminated. When it is determined that a plane for which the writing to the "G" level has not terminated exists (S61, No), the processing returns to S5 to continue the set write operation.

As described above, even in a case where plural planes exist in the nonvolatile memory, when the program operation for the "F" level which is the second highest level just below the highest level has terminated for a plane having the lowest writing speed, the potential (VSGD) of the select gate lines SGD of all the planes is lowered. As a result, increase of the number of fail bits can be prevented for all the planes without performing complicated control on each of the planes, and the reliability of the semiconductor memory device can be enhanced.

Figure 17:
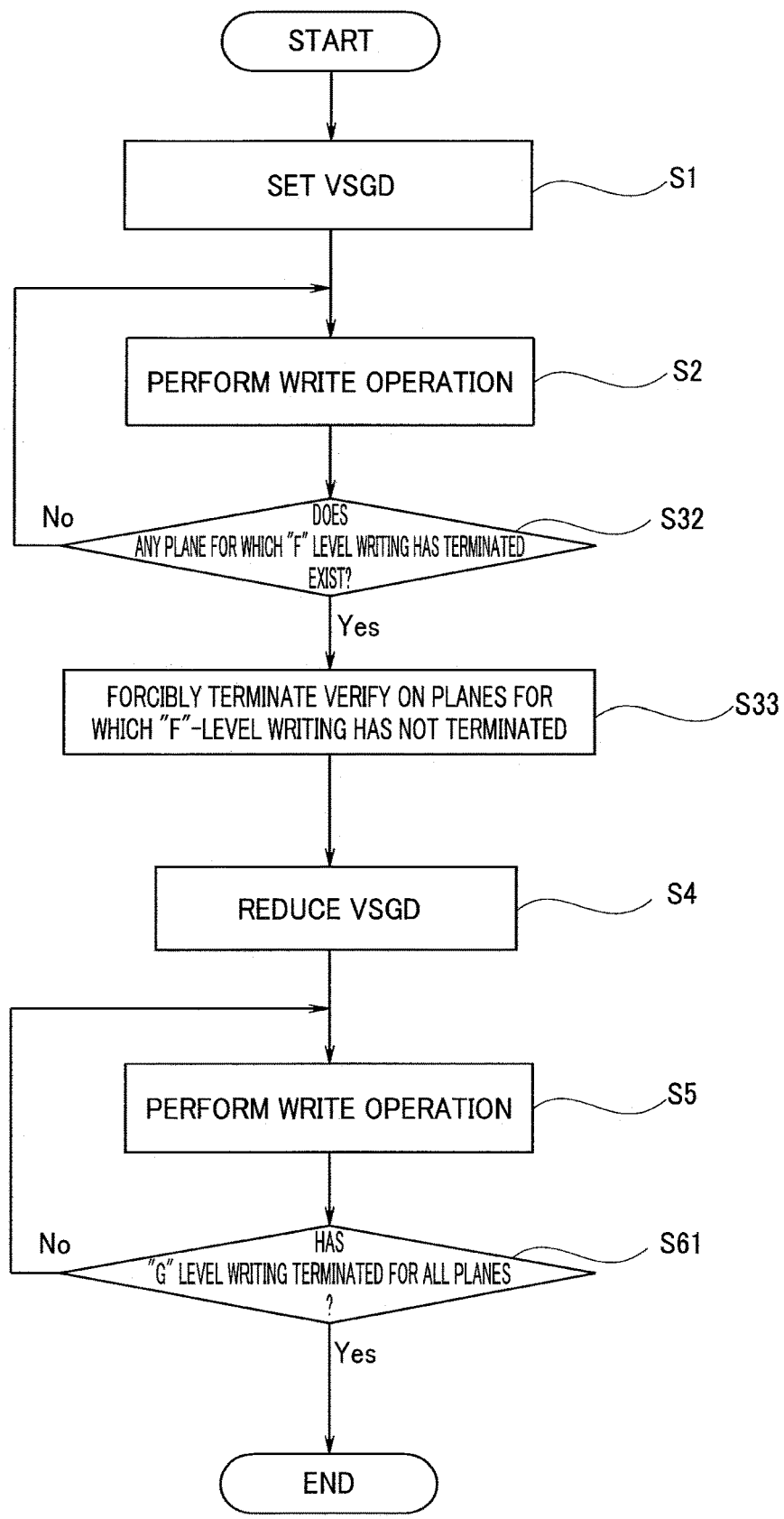
FIG. 17 is a flowchart showing another example of the procedure of the write operation in the modification.

Note that the write operation on the nonvolatile memory having plural planes may be performed as shown in FIG. 17. FIG. 17 is a flowchart showing another example of the procedure of the write operation in the modification.

First, the potential (VSGD) of the select gate line SGD in the write operation is initialized for all planes (S1). Subsequently, the set write operation is executed successively from the first loop for all the planes (S2). In the write operation of S2, the program operation using both the normal mode and the QPW mode is executed.

When it is determined that the writing to the "F" level has terminated for any plane (S32, Yes), the writing to the "F" level is forcibly terminated for all the planes (S33). Thereafter, the potential (VSGD) of the select gate line SGD is lowered by a predetermined amount for all the planes (S4). On the other hand, when it is not determined that a plane for which the writing to the "F" level has terminated exists (S32, No), the processing returns to S2 to continue the set write operation.

For example, it is determined that the writing to the "F" level has terminated in the verify operation of the sixteenth loop for the plane 26A, but the writing to the "F" level has not terminated in the verify operation of the sixteenth loop for the plane 26B, the writing to the "F" level on the plane 26B is forcibly terminated. The semiconductor memory device of the present embodiment includes the ECC circuit 14, and error correction is possible by the ECC circuit 14. Therefore, since data correction can be also performed on planes for which the writing to the "F" level is forcibly terminated, reliability can be maintained.

When the change of the potential (VSGD) of the select gate line SGD is completed for all the planes in S4, the write operation on the subsequent loops is executed (S5). Since the program operation in S5 is executed on the uppermost "G" level, only the normal mode is executed and the QPW mode is not executed.

When it is determined that the writing to the "G" level has terminated in the verify operation in S5 for all the planes (S61, Yes), the write operation on the NAND memory cell array 23 is terminated. When it is determined that a plane for which the writing to the "G" level has not terminated exists (S61, No), the processing returns to S5 to continue the set write operation.

As described above, when the program operation of the "F" level which is the second highest level just below the highest level has terminated for a plane having the highest writing speed, the potential (VSGD) of the select gate lines SGD of all the planes is lowered. As a result, increase of the number of fail bits can be prevented for all the planes without performing complicated control on each of the planes, and the reliability of the semiconductor memory device can be enhanced.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory strings each including a select transistor and a memory cell that is connected to one end of the select transistor and can be set to any one of at least four different threshold voltages;
a select gate line that is commonly connected to gates of the select transistors of the plurality of memory strings;
a plurality of bit lines that are individually connected to other ends of the select transistors of the plurality of memory strings;
a word line that is commonly connected to gates of the memory cells of the plurality of memory strings; and
a control unit configured to execute a write sequence to write predetermined data into the memory cells, the write sequence including a plurality of loops, each loop including a program operation to write data into the respective memory cells and a verify operation to verify the data written in the respective memory cells,
wherein a voltage applied to the select gate line in the program operation of a last loop of the plurality of loops is lower than a voltage applied to the select gate line in the program operation of a first loop of the plurality of loops;
further comprising a plurality of planes each including the plurality of memory strings,
wherein the control unit changes a voltage applied to the select gate line connected to all the planes in accordance with a result of the verify operation on all the planes,
wherein when determining in the verify operation that the program operation targeting a second highest threshold voltage out of a plurality of threshold voltages settable in the memory cells is completed in any one of the plurality of planes, the control unit terminates the program operation targeting a second highest threshold voltage for other planes, and lowers the voltage applied to the select gate line connected to all the planes by a predetermined width.

2. The semiconductor memory device according to claim 1, wherein the control unit changes a gate voltage applied to the select gate line according to a result of the verify operation.

3. The semiconductor memory device according to claim 1, wherein the control unit lowers a voltage applied to the select gate line by a predetermined width when it is determined in the verify operation that the program operation targeting a second highest threshold voltage among the plurality of threshold voltages settable in the memory cells is completed.

4. The semiconductor memory device according to claim 1, wherein a plurality of the memory cells are arranged in a vertical direction with respect to a semiconductor substrate in each of the strings,
- the word line is stacked in plurality in the vertical direction with respect to the semiconductor substrate so as to correspond to the plurality of memory cells respectively, and
- the control unit adjusts a voltage applied to the select gate line according to positions in the vertical direction of the memory cells.

5. The semiconductor memory device according to claim 3, wherein when determining in the verify operation that the program operation targeting the second highest threshold voltage among the plurality of threshold voltages settable in the memory cells is completed, the control unit lowers a voltage applied to the bit lines in the program operation by a predetermined width.

\* \* \* \* \*